United States Patent
Lee et al.

(10) Patent No.: US 12,159,828 B2
(45) Date of Patent: Dec. 3, 2024

(54) SEMICONDUCTOR STRUCTURE WITH SHIELDING STRUCTURE FOR THROUGH SILICON VIA AND MANUFACTURING METHOD THEREOF

(71) Applicant: CHANGXIN MEMORY TECHNOLOGIES, INC., Hefei (CN)

(72) Inventors: Tzung-Han Lee, Hefei (CN); Chih-Cheng Liu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 300 days.

(21) Appl. No.: 17/842,945

(22) Filed: Jun. 17, 2022

(65) Prior Publication Data

US 2022/0367341 A1    Nov. 17, 2022

Related U.S. Application Data

(63) Continuation of application No. PCT/CN2021/120403, filed on Sep. 24, 2021.

(30) Foreign Application Priority Data

May 12, 2021 (CN) .......................... 202110518512.7

(51) Int. Cl.
*H01L 23/522* (2006.01)
*H01L 21/762* (2006.01)
*H01L 23/31* (2006.01)

(52) U.S. Cl.
CPC .... *H01L 23/5225* (2013.01); *H01L 21/76224* (2013.01); *H01L 23/31* (2013.01)

(58) Field of Classification Search
CPC ................................................ H01L 23/5225
(Continued)

(56) References Cited

U.S. PATENT DOCUMENTS 8,079,134 B2* 12/2011 Maki .................. H01F 17/06
427/116
8,860,185 B2* 10/2014 Yuan ................... H01L 23/585
257/620

(Continued)

FOREIGN PATENT DOCUMENTS

CN     103824840 B      3/2017
CN     106847770 A      6/2017

(Continued)

*Primary Examiner* — Ajay Arora
(74) *Attorney, Agent, or Firm* — Kilpatrick Townsend & Stockton LLP

(57) ABSTRACT

Provided are a semiconductor structure and a method for manufacturing a semiconductor structure. The semiconductor structure includes: a through silicon via and a shielding structure disposed at an outer side of the through silicon via, in which the shielding structure includes at least two non-closed annular shielding layers surrounding the through silicon via and at least one conductive plug configured to connect two adjacent ones of the non-closed annular shielding layers; the at least two non-closed annular shielding layers and the at least one conductive plug are alternately distributed along an extending direction of the through silicon via and sequentially connected to form a conductive path, and current flow directions in two adjacent ones of the non-closed annular shielding layers in the conductive path are opposite.

19 Claims, 13 Drawing Sheets

(58) Field of Classification Search
USPC .......................................................... 257/678
See application file for complete search history.

(56) References Cited

U.S. PATENT DOCUMENTS

| | | | |
|---|---|---|---|
| 9,679,671 B2 * | 6/2017 | Yoon | ................. H01L 23/49827 |
| 2010/0024202 A1 | 2/2010 | Maki | |
| 2012/0056680 A1 | 3/2012 | Kim et al. | |
| 2013/0187280 A1 | 7/2013 | Yuan | |
| 2016/0148714 A1 | 5/2016 | Yoon | |
| 2018/0323369 A1 | 11/2018 | Kirby | |

FOREIGN PATENT DOCUMENTS

| | | |
|---|---|---|
| CN | 110651372 A | 1/2020 |
| CN | 111584457 A | 8/2020 |

* cited by examiner

SEMICONDUCTOR STRUCTURE WITH SHIELDING STRUCTURE FOR THROUGH SILICON VIA AND MANUFACTURING METHOD THEREOF

CROSS-REFERENCE TO RELATED APPLICATIONS

This application is a continuation application of International Application No. PCT/CN2021/120403, filed on Sep. 24, 2021, which claims priority to Chinese Patent Application No. 202110518512.7, filed on May 12, 2021. The disclosures of International Application No. PCT/CN2021/120403 and Chinese Patent Application No. 202110518512.7 are hereby incorporated by reference in their entireties.

BACKGROUND

As the feature size of integrated circuits is shrinking and the interconnection density of devices is increasing, traditional 2D packaging cannot meet the needs of the industry. Vertical interconnection stacked packaging mode based on through silicon via (TSV) interconnection technology has led the development trend of the packaging technology due to its advantages of short distance interconnection and high density integration.

However, there is a problem of mutual interference between a through silicon via and a nearby metal conductive structure of a semiconductor structure when transmitting signals. In the related art, in order to solve the above problem, a shielding structure is provided around the through silicon via, and the specific structure and performance of the shielding structure are still to be optimized.

SUMMARY

The present disclosure relates to a semiconductor structure and a manufacturing method thereof.

Embodiments of the present disclosure provide a semiconductor structure. The semiconductor structure includes: a through silicon via and a shielding structure disposed at an outer side the through silicon via;

The shielding structure includes at least two non-closed annular shielding layers surrounding the through silicon via and at least one conductive plug configured to connect two adjacent ones of the annular shielding layers, the at least two non-closed annular shielding layers and the at least one conductive plug are alternately distributed along an extending direction of the through silicon via and sequentially connected to form a conductive path;

Current flow directions in two adjacent ones of the annular shielding layers in the conductive path are opposite.

Embodiments of the present disclosure further provide a method for manufacturing a semiconductor structure. The method includes the following operations.

A shielding structure including at least two non-closed annular shielding layers and at least one conductive plug configured to connect two adjacent ones of the annular shielding layers are formed, which includes: alternately forming the at least two non-closed annular shielding layers and the at least one conductive plug, and sequentially connecting the at least two non-closed annular shielding layers and the at least one conductive plug to form a conductive path, in which the current flow directions of two adjacent ones of the non-closed annular shielding layers in the conductive path are opposite.

A through silicon via inside the shielding structure is formed, in which the non-closed annular shielding layers surround the through silicon via.

DETAILED DESCRIPTION

Figure 1:
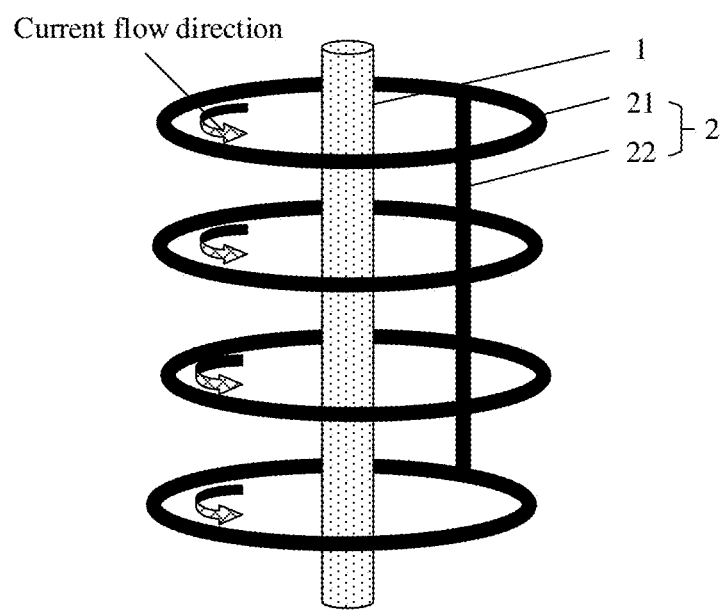
FIG. 1 illustrates a schematic diagram of a semiconductor structure provided in the related art.

Exemplary implementations of the present disclosure will be described in more detail below with reference to the accompanying drawings. While exemplary implementations of the present disclosure are shown in the accompanying drawings, it should be understood that the present disclosure may be implemented in various forms without being limited by the specific implementations set forth herein. Rather, these implementations are provided in order to enable a more thorough understanding of the present disclosure and to communicate the full scope of the disclosure of the present disclosure to those skilled in the art.

A number of specific details are given in the following description to provide a more thorough understanding of the present disclosure. However, it will be apparent to those skilled in the art that the present disclosure may be implemented without one or more of these details. In other examples, some technical features known in the art are not described in order to avoid confusion with the present disclosure; That is, all features of the actual embodiment are not described herein, and well-known functions and structures are not described in detail.

In the drawings, the sizes of the layers, zones, elements and their relative sizes may be exaggerated for clarity. The same reference numerals throughout indicate the same elements.

It should be understood that when an element or layer is referred to as "on . . . ," "adjacent to . . . ," "connected to . . . ," or "coupled to . . . " other elements or layers, it can be directly on the other elements or layers, adjacent to, connected to or coupled to other elements or layers, or intervening elements or layers may be present. In contrast, when an element is referred to as being "directly on . . . ," "directly adjacent to . . . ," "directly connected to . . . ," or "directly coupled to . . . " other elements or layers, there are no intervening elements or layers. It should be understood that although the terms first, second, third and the like may be used to describe various elements, components, zones, layers and/or portions, these elements, components, zones, layers and/or portions should not be limited by these terms. These terms are used only to distinguish one element, component, zone, layer or portion from another. Thus, without departing from the teachings of the present disclosure, the first element, component, zone, layer, or portion discussed below may be represented as a second element, component, zone, layer, or portion. And when the second element, component, zone, layer, or portion is discussed, it does not indicate that the first element, component, zone, layer, or portion necessarily exists in the present disclosure.

Spatial relationship terms such "under . . . ," "below . . . ," "below," "underneath . . . ," "on . . . ," "above" etc., may be used herein for ease of description to describe the relationship of one element or feature shown in the figure to other elements or features. It should be understood that, in addition to the orientation shown in the figure, spatial relationship terms are intended to include different orientations of devices in use and operation. For example, if the device in the drawings flips, then elements or features described as "below" or "under" or "underneath" other elements will be oriented "on" the other elements or features. Therefore, the exemplary terms "below . . . " and "under . . . " may include both an orientation of above and below. The device may additionally be oriented (rotated 90 degrees or otherwise) and the spatial descriptors used herein are interpreted accordingly.

The terms used herein are intended only to describe specific embodiments and is not intended as a limitation of the present disclosure. When used herein, "a", "an" and "the/said" in the singular form are also intended to include the plural form unless the context clearly indicates another manner. It shall also be understood that the terms "comprise/ comprising" and/or "include/including," when used in this specification, determine the presence of the features, integers, steps, operations, elements and/or components, but not rule out the presence or addition of one or more other features, integers, steps, operations, elements, components and/or groups. As used herein, the term "and/or" includes any and all combinations of the items listed herein.

Vertical interconnection stacked packaging mode based on through silicon via (TSV) interconnection technology is to stack two or more semiconductor chips together and transmit signals between the semiconductor chips through the TSVs.

Studies show that a through silicon via produces a large induced magnetic field at a high current, and the induced magnetic field affects signal transmission in a metal conductive structure near the through silicon via. At the same time, the signals transmitted in the metal conductive structure also interfere with the through silicon via.

In order to reduce the crosstalk effect between the through silicon via and the metal conductive structure, researchers attempts to provide a shielding structure around the through silicon via.

FIG. 1 illustrates a schematic diagram of a semiconductor structure provided in the related art. As illustrated in the figure, the semiconductor structure includes a through silicon via 1 and a shielding structure 2 disposed around the through silicon via 1. The shielding structure 2 includes a plurality of annular shielding layers 21 distributed along the extending direction of the through silicon via 1. The annular shielding layers 21 are disposed around the through silicon via 1, and the plurality of annular shielding layers 21 are connected by a conductive plug 22. The shielding structure 2 can shield the induced magnetic field generated when the through silicon via 1 is conducting a high current, and at the same time, the shielding structure 2 can shield the signal of a surrounding metal conductive structure from interfering with the through silicon via 1.

However, the currents in the respective annular shielding layers 21 in the above shielding structure 2 have the same flow direction, thus generate induced magnetic fields superimposed on each other, thereby affecting other device structures located in the vicinity thereof.

Accordingly, the following technical solutions of embodiments of the present disclosure are proposed.

The embodiments of the present disclosure provide a semiconductor structure. The semiconductor structure includes: a through silicon via and a shielding structure disposed at the outer side of the through silicon via. The shielding structure includes at least two non-closed annular shielding layers surrounding the through silicon via and at least one conductive plug configured to connect two adjacent ones of the annular shielding layers. The at least two non-closed annular shielding layers and the at least one conductive plug are alternately distributed along an extending direction of the through silicon via and sequentially connected to form a conductive path, in which current flow directions of two adjacent ones of the annular shielding layers in the conductive path are opposite.

In order to make the above objectives, features and advantages of the present disclosure more obvious and understandable, the following describes the specific implementations of the present disclosure in detail with reference to the accompanying drawings. When the embodiments of the present disclosure are described in detail, for convenience of description, the schematic diagrams are partially enlarged, but not according to the general scale. In addition, the schematic diagrams are merely examples, which shall not limit the protection scope of the present disclosure herein.

Figure 2:
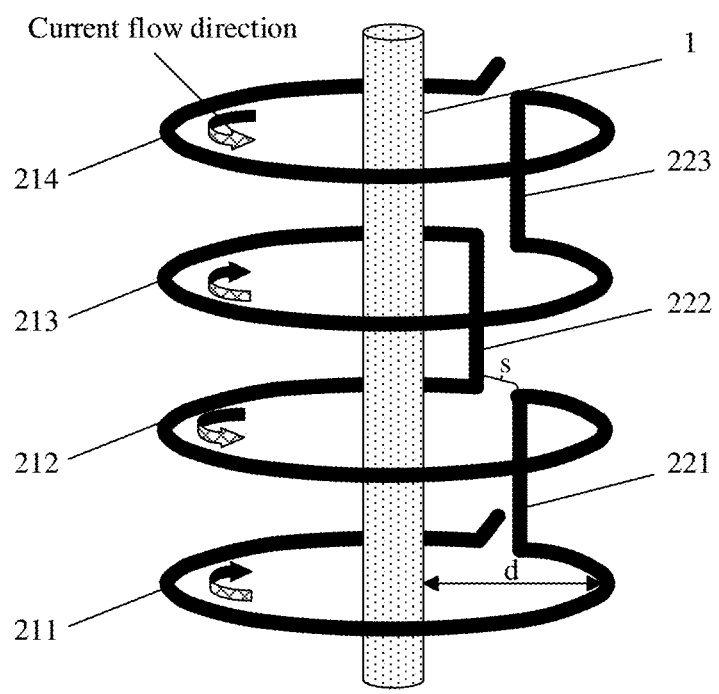
FIG. 2 illustrates a schematic diagram of a semiconductor structure according to an embodiment of the present disclosure.

FIG. 2 illustrates a schematic diagram of a semiconductor structure according to an embodiment of the present disclosure. As illustrated in the figure, the semiconductor structure includes: a through silicon via 1 and a shielding structure 2 disposed around the through silicon via 1, the shielding structure 2 includes at least two non-closed annular shielding layers 211, 212, 213, 214 surrounding the through silicon via and at least one conductive plugs 221, 222, 223 configured to respectively connect any two adjacent annular shielding layers.

The annular shielding layers 211, 212, 213, 214 and the conductive plugs 221, 222, 223 are alternately distributed along the extending direction of the through silicon via extends and sequentially connected to form a conductive path. The current flow directions of two adjacent ones of the annular shielding layers in the conductive path are opposite.

In an embodiment, each non-closed annular shielding layer includes a current inflow end and a current outflow end, the current inflow end refers to the end into which the current flows, and the current outflow end refers to the end out of which the current flows. The relative positional relationship between the current inflow ends and the current outflow ends of any two adjacent annular shielding layers is reversed so that the current flow directions in the two adjacent ones of the annular shielding layers in the conductive path are opposite. Taking the adjacent annular shielding layers 212 and 213 as an example, the current inflow end of the annular shielding layer 212 is located on the left side of the current outflow end thereof, while the current inflow end of the annular shielding layer 213 is located on the right side of the current outflow end thereof. The current outflow end of the annular shielding layer 213 is connected to the current inflow end of the annular shielding layer 212 through the conductive plug 222, so that the current flow direction in the annular shielding layer 212 is counterclockwise and the current flow direction in the annular shielding layer 213 is clockwise.

It should be noted that the current flow direction indicated in FIG. 2 is merely an example, and the current flow direction in the conductive path may be contrary to that indicated in FIG. 2.

There is a distance "s" between a current inflow end and a corresponding current outflow end of an annular shielding layer, and the size of the distance "s" affects the shielding effect of the shielding structure on the through silicon via. In some embodiments, the distance "s" is less than a line width of the annular shielding layer.

The number of the annular shielding layers in FIG. 2 is four, but is not limited thereto, and the number of the annular shielding layers may be other values, may be selected between 2 and 6.

The shape of the annular shielding layers in FIG. 2 is substantially circular, but is not limited thereto, and the annular shielding layers may have other shapes, such as a polygonal ring having a number of edges greater than or equal to 4.

There is a gap "d" between an outer side wall of the through silicon via and an inner side wall of the annular shielding layer, and the size of the gap "d" affects the shielding effect of the shielding structure. In some embodiments, the width of the gap "d" is between 1-10 μm.

In an embodiment, the projections of the at least two annular shielding layers in the extending direction of the through silicon via at least partially overlap. Without limitation, in other embodiments, the projections of the at least two annular shielding layers in the extending direction of the through silicon via do not overlap.

In an embodiment, the projection of the conductive plug in the extending direction of the through silicon via falls into the projections of the two adjacent annular shielding layers in the extending direction of the through silicon via.

It can be understood that, in the at least two annular shielding layers, the size, shape, line width and end position of each annular shielding layer may be the same or different.

Next, the semiconductor structure provided in the embodiments of the present disclosure and its positive effects are described in further detail with reference to the specific example illustrated in FIGS. 3A-3B.

Figure 3A:
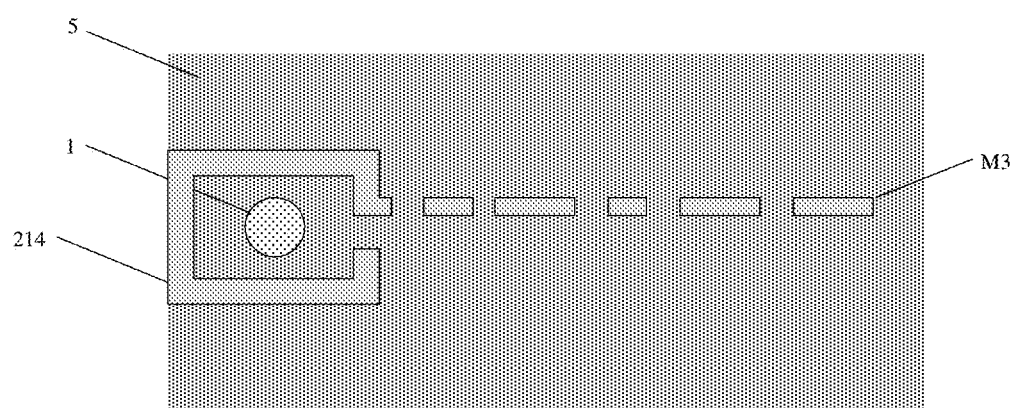
FIG. 3A illustrate a cross-sectional view of a semiconductor structure provided in an embodiment of the present disclosure in direction of B-B' shown in FIG. 3B.
Figure 3B:
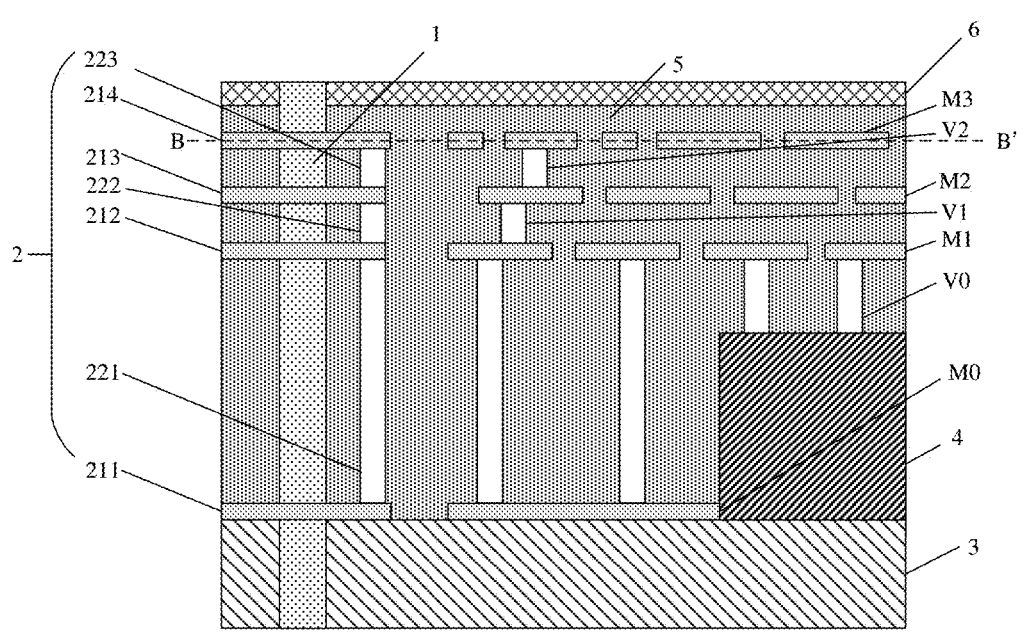
FIG. 3B illustrate a schematic front projection view of a semiconductor structure provided in an embodiment of the present disclosure.

FIGS. 3A and 3B illustrate different views of a semiconductor structure provided in an embodiment of the present disclosure. FIG. 3A illustrates a sectional view of the semiconductor structure according to an embodiment of the present disclosure taken along line B-B' in FIG. 3B, and FIG. 3B illustrates a schematic front projection view of the semiconductor structure according to an embodiment of the present disclosure. As illustrated in the figures, the semiconductor structure includes a substrate 3 on which a through silicon via 1 and a shielding structure 2 are formed.

In some embodiments, the substrate may be a silicon substrate. In some other embodiments, the substrate may include other semiconductor elements, such as germanium; or include semiconductor compounds, such as silicon carbide, gallium arsenic, gallium phosphide, indium phosphide, indium arsenide and/or indium antimonide; or other semiconductor alloys, such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP) and/or gallium indium phosphide (GaInAsP); or combinations thereof.

In some embodiments, the through silicon via 1 has a diameter of 2-6 μm, e.g., 3 μm.

The shielding structure 2 includes annular shielding layers 211, 212, 213, 214 and three conductive plugs 221, 222, 223 that are configured to connect adjacent annular shielding layers, and the annular shielding layers 211, 212, 213, 214 are non-closed as illustrated in FIG. 3A.

The thicknesses of the annular shielding layers 211, 212, 213, 214 may be the same or different. In some embodiments, thicknesses of the annular shielding layers 211, 212, 213, 214 are between 0.1-0.5 μm.

The semiconductor structure further includes a device 4 and the through silicon via 1 is configured to transmit signal between the device 4 and other devices.

The device 4 may be a memory, such as dynamic random access memory (DRAM), or a logic chip.

In an embodiment, the semiconductor structure further includes a metal conductive structure including at least two metal layers M0, M1, M2, M3 and at least one contact hole V0, V1, V2 configured to connect two adjacent metal layers, the metal layers M0, M1, M2, M3 and the contact hole V0, V1, V2 are alternately distributed along the direction where the through silicon via extends.

In an embodiment, the annular shielding layers 211, 212, 213, 214 in the shielding structure 2 and the metal layers M0, M1, M2, M3 in the metal conductive structure are formed simultaneously in the same process step, and the conductive plug 221, 222, 223 in the shielding structure 2 and the contact hole V0, V1, V2 in the metal conductive structure are formed simultaneously in the same process step.

Specifically, the annular shielding layer 211 and the metal layer M0 are formed in the same process step; the conductive plug 221 and the contact hole V0 are formed in the same process step; the annular shielding layer 212 and the metal layer M1 are formed in the same process step; the conductive plug 222 and the contact hole V1 are formed in the same process step; the annular shielding layer 213 and the metal layer M2 are formed in the same process step; the conductive plug 223 and the contact hole V2 are formed in the same process step; the annular shielding layer 214 and the metal layer M3 are formed in the same process step.

It should be noted that a layer number of the metal conductive structure may be more or less than the layer number of the shielding structure. Specifically, a layer number of the metal layers and a number of the contact hole included in the metal conductive structure are not limited to those illustrated in FIG. 3B, and the number of the metal layers and the contact hole may be more or less.

In order to ensure shielding performance, in an embodiment, a distance between a lower surface of the annular shielding layer 212 and an upper surface of the annular shielding layer 214 is 1-3 μm.

In an embodiment, one of the metal layers in the metal conductive structure is electrically connected to the through silicon via through a non-closed opening of an annular shielding layer in the shielding structure.

As illustrated in FIG. 3A, the metal layer M3 is electrically connected to the through silicon via 1 through the non-closed opening of the annular shielding layer 214.

It should be noted that the embodiments of the present disclosure may be other metal layers, such as the metal layer M2, the metal layer M1, or the metal layer M0 connected to the through silicon via 1. When the metal layer M2 is electrically connected to the through silicon via 1, the metal layer M2 is electrically connected to the through silicon via 1 through the non-closed opening of the annular shielding layer 213. When the metal layer M1 is electrically connected to the through silicon via 1, the metal layer M1 is electrically connected to the through silicon via 1 through the non-closed opening of the annular shielding layer 212. When the metal layer M0 is electrically connected to the through silicon via 1, the metal layer M0 is electrically connected to the through silicon via 1 through the non-closed opening of the annular shielding layer 211.

In an embodiment, the semiconductor structure further includes a dielectric layer 5 covering the through silicon via 1, the annular shielding layers 211-213 and the conductive plugs 221-223.

It should be noted that the dielectric layer 5 is not a single layer structure, which is formed from multiple layers of insulating material in a plurality of processes.

Figure 4:
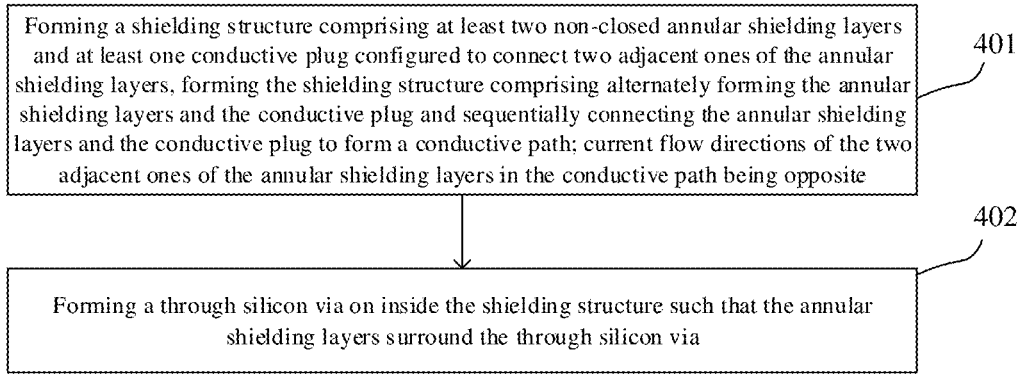
FIG. 4 illustrates a flowchart of a method for manufacturing a semiconductor structure according to an embodiment of the present disclosure.

The embodiments of the present disclosure further provide a method for manufacturing a semiconductor structure. As illustrated in FIG. 4, the method includes the following operations.

In S401, a shielding structure is formed that includes at least two non-closed annular shielding layers and at least one conductive plug configured to connect two adjacent ones of the annular shielding layers. Forming the shielding structure includes: alternately forming the annular shielding layers and the conductive plug, and sequentially connecting the annular shielding layers and the conductive plug to form a conductive path, current flow directions in the two adjacent ones of the annular shielding layers in the conductive path are opposite.

In S402, a through silicon via is formed on an inner side of the shielding structure so that the annular shielding layers surround the through silicon via.

Next, the method for manufacturing a semiconductor structure according to an embodiment of the present disclosure is described in further detail with reference to FIGS. 5A-5H.

Firstly, S401 is performed to form the shielding structure, as illustrated in FIGS. 5A-5F. The shielding structure includes at least two non-closed annular shielding layers 211-214 and at least one conductive plug 221-223 configured to connect two adjacent ones of the annular shielding layers. The annular shielding layers 211-214 and the conductive plug 221-223 are alternately distributed along the direction where the through silicon via 1 extends and are sequentially connected to form the conductive path. The current flow directions of the current in the two adjacent ones of the annular shielding layers in the conductive path are opposite.

In an embodiment, the metal conductive structure is formed while the shielding structure is formed, as illustrated in FIGS. 5A-5F. The metal conductive structure includes at least two metal layers M0, M1, M2, M3 and at least one contact hole V0, V1, V2 configured to connect any of two adjacent ones of the metal layers. The metal layers M0, M1, M2, M3 and the contact holes V0, V1, V2 are alternately distributed along the extending direction of the through silicon via.

In a specific embodiment, forming the metal conductive structure while forming the shielding structure 2 includes the following operations.

Each annular shielding layer of the shielding structure and the corresponding metal layer of the metal conductive structure, which are in the same or similar height on the substrate, are simultaneously formed in the same process step.

Each conductive plug of the shielding structure and the corresponding contact hole of the metal conductive structure, which are in the same or similar height on the substrate, are simultaneously formed in the same process step.

Next, the manufacturing processes of the shielding structure 2 and the metal conductive structure are described in detail with reference to FIGS. 5A-5F. It should be clear that the manufacturing process described below is only an example, and other methods may be used to form the shielding structure 2 and the metal conductive structure.

Figure 5A:
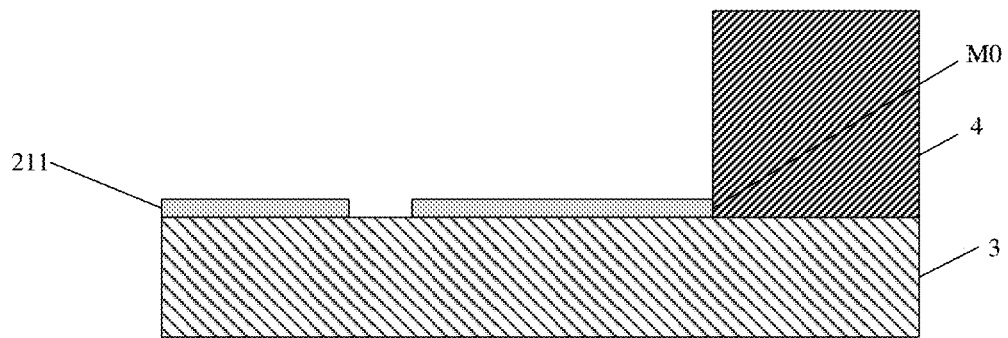
FIGS. 5A-5H illustrate diagrams of a process flow of a method for manufacturing a semiconductor structure according to an embodiment of the present disclosure.

Referring to FIG. 5A, a substrate 3 is provided, a device 4 is provided on the substrate 3, and a metal layer M0 and an annular shielding layer 211 are deposited around the device 4. The metal layer M0 and the annular shielding layer 211 are formed in the same process, and the metal layer M0 is used as a metal conductive structure.

The substrate may be a silicon substrate. In some other embodiments, the substrate may include another semiconductor element, such as germanium; or include a semiconductor compound, such as silicon carbide, gallium arsenic, gallium phosphide, indium phosphide, indium arsenide and/or indium antimonide; or another semiconductor alloy, such as: silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP) and/or gallium indium phosphide (GaInAsP); or combinations thereof.

The device 4 may be a memory, such as a dynamic random access memory (DRAM), or a logic chip.

Figure 5B:
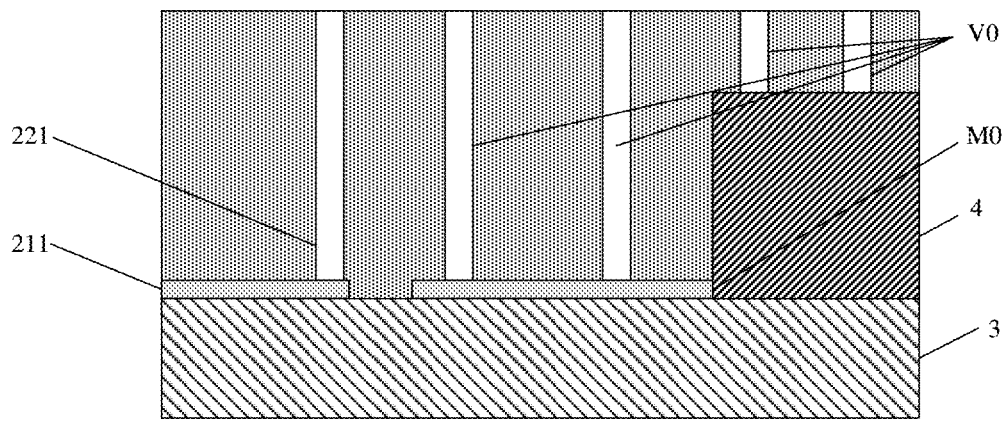

Referring to FIG. 5B, a dielectric layer is formed on the substrate 3, and a conductive plug 221 and contact holes V0 are formed in the dielectric layer.

The dielectric layer covers the device 4, the annular shielding layer 211 and the metal layer M0.

In a specific embodiment, forming the conductive plug 221 and the contact holes V0 includes: forming through vias penetrating the dielectric layer, and then depositing a conductive material in the through vias to forming the conductive plug 221 and the contact holes V0.

Figure 5C:
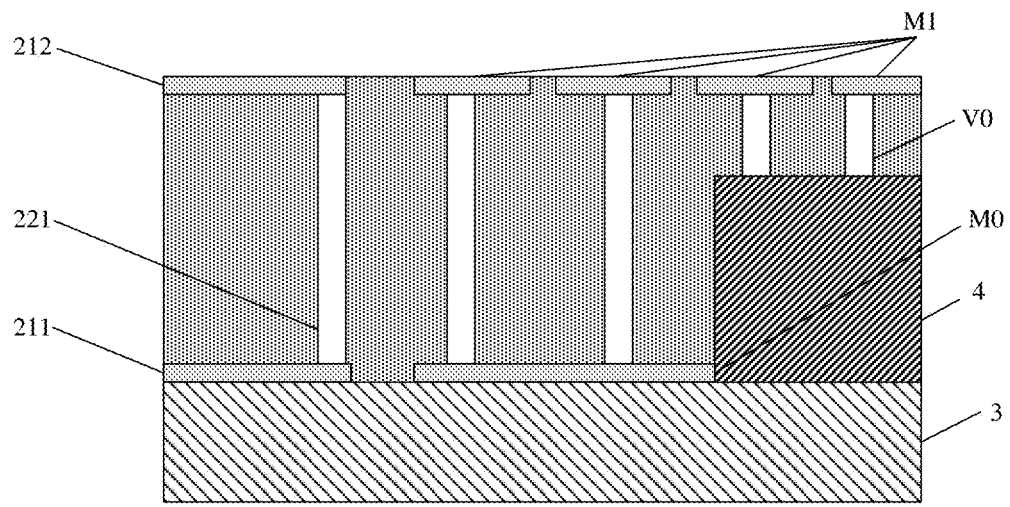

Referring to FIG. 5C, an annular shielding layer 212 and a metal layer M1 electrically connected to the conductive plug 221 and the contact holes V0 are formed, respectively.

In a specific embodiment, the annular shielding layer 212 and the metal layer M1 are formed in the same process step.

In a specific embodiment, forming the annular shielding layer 212 and the metal layer M1 includes the following operations.

A dielectric layer is formed and patterned; and the annular shielding layer 212 and the metal layer M1 are formed in the patterned dielectric layer.

Figure 5D:
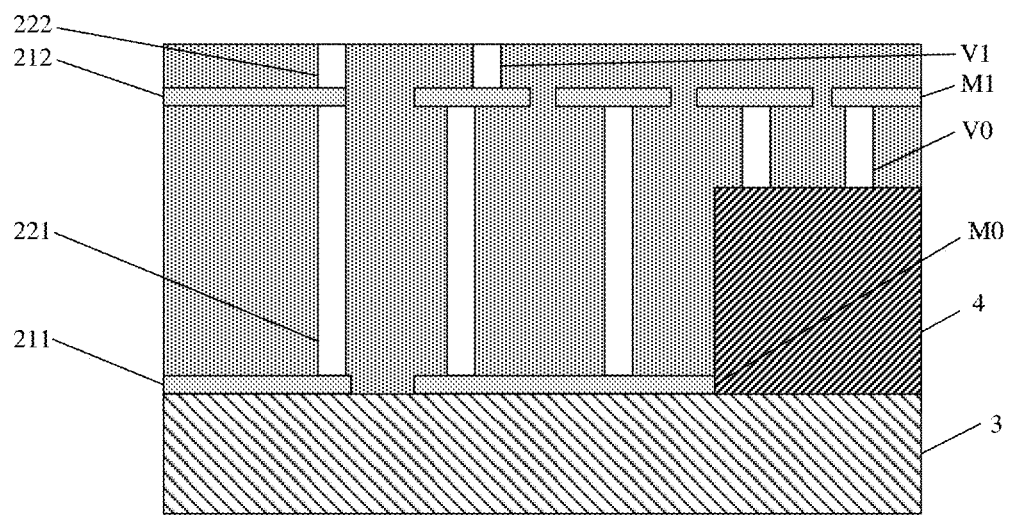

Referring to FIG. 5D, a conductive plug 222 and a contact hole V1 electrically connected to the annular shielding layer 212 and the metal layer M1 are formed, respectively.

In a specific embodiment, the conductive plug 222 and the contact hole V1 are formed in the same process step.

In a specific embodiment, forming the conductive plug 222 and the contact hole V1 includes: forming a dielectric layer covering the annular shielding layer 212 and the metal layer M1, forming through vias in the dielectric layer, and depositing a conductive material in the through vias and forming the conductive plug 222 and the contact hole V1.

Figure 5E:
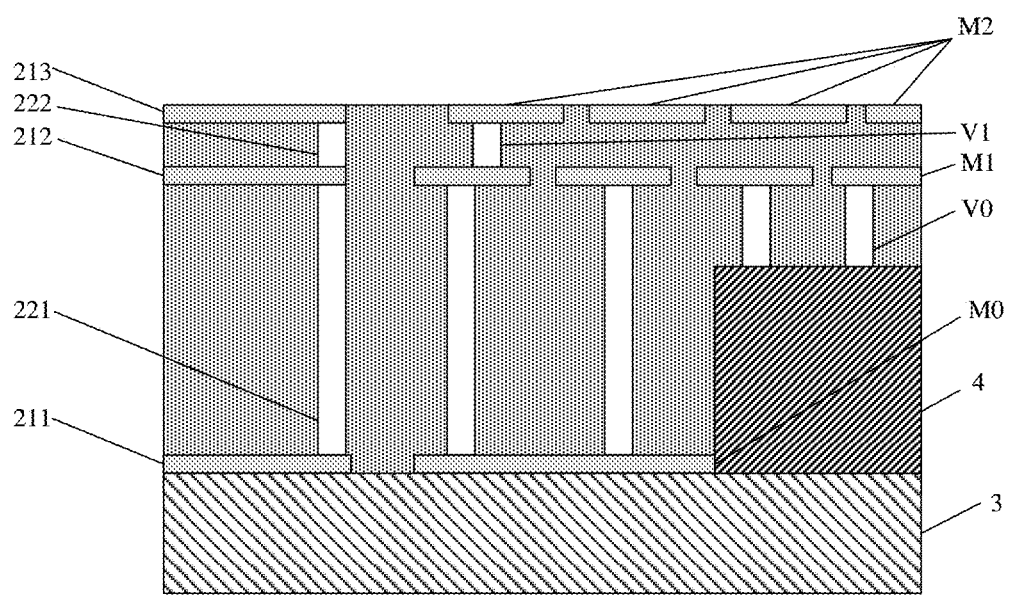

Referring to FIG. 5E, an annular shielding layer 213 and a metal layer M2 electrically connected to the conductive plug 222 and the contact hole V1 are formed, respectively.

In a specific embodiment, the annular shielding layer 213 and the metal layer M2 are formed in the same process step.

In a specific embodiment, forming the annular shielding layer 213 and the metal layer M2 includes the following operations.

A dielectric layer is formed and patterned; and the annular shielding layer 213 and the metal layer M2 are formed in the patterned dielectric layer.

Figure 5F:
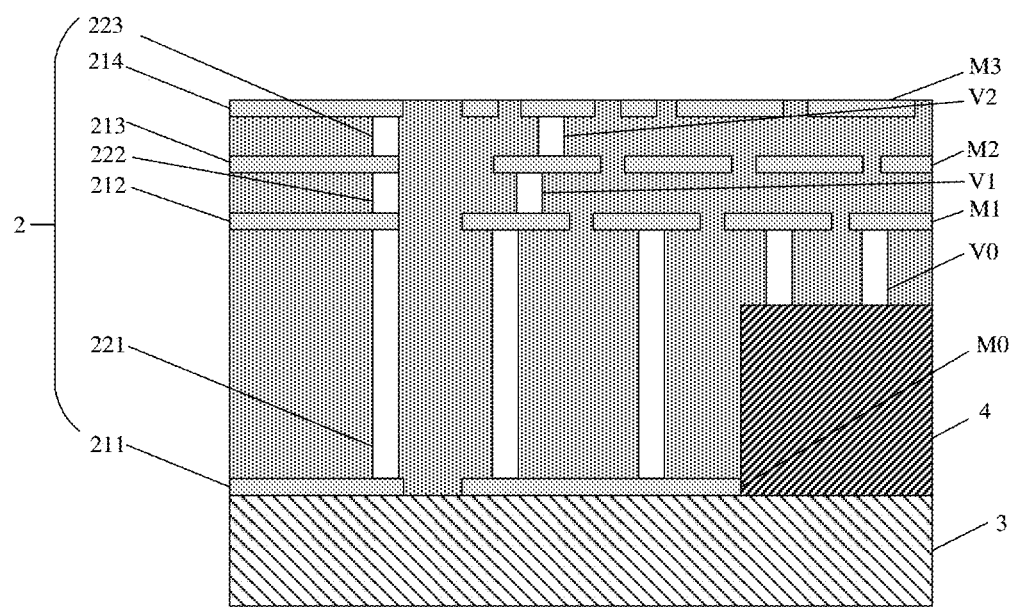

Referring to FIG. 5F, a conductive plug 223 and contact holes V2 are formed, and then an annular shielding layer 214 and a metal layer M3 are formed on the conductive plug 223 and the contact holes V2.

In an embodiment, the process for forming the conductive plug 223 and the contact holes V2 is with the same as the process for forming the conductive plug 222 and the contact hole V1.

In an embodiment, the process for forming the annular shielding layer 214 and the metal layer M3 is with the same as the process for forming the annular shielding layer 213 and the metal layer M2.

So far, the manufacturing of the shielding structure 2 is completed.

The shielding structure includes four non-closed annular shielding layers 211, 212, 213, 214 surrounding the through silicon via and three conductive plugs 221, 222, 223 configured to connect adjacent annular shielding layers.

It should be noted that the number of annular shielding layers of a shielding structure is not limited to 4, and may be other values. In some embodiments, the number of annular shielding layers is 2-6.

In an actual process, a ring-shaped annular shielding layer is difficult to be achieved, so that an annular shielding layer is formed to a polygon having a number of edges greater than or equal to 4. When forming the polygonal annular shielding layer, a pattern may deform during an exposure due to the optical proximity effect, so the final desired polygonal pattern is usually obtained by means of a virtual auxiliary pattern. At the same time, the polygonal annular shielding layer has an outside corner ring area. In order to reduce the stress in the outside corner ring area, an auxiliary pattern may be provided in the outside corner ring area to reduce the stress.

Figure 5G:
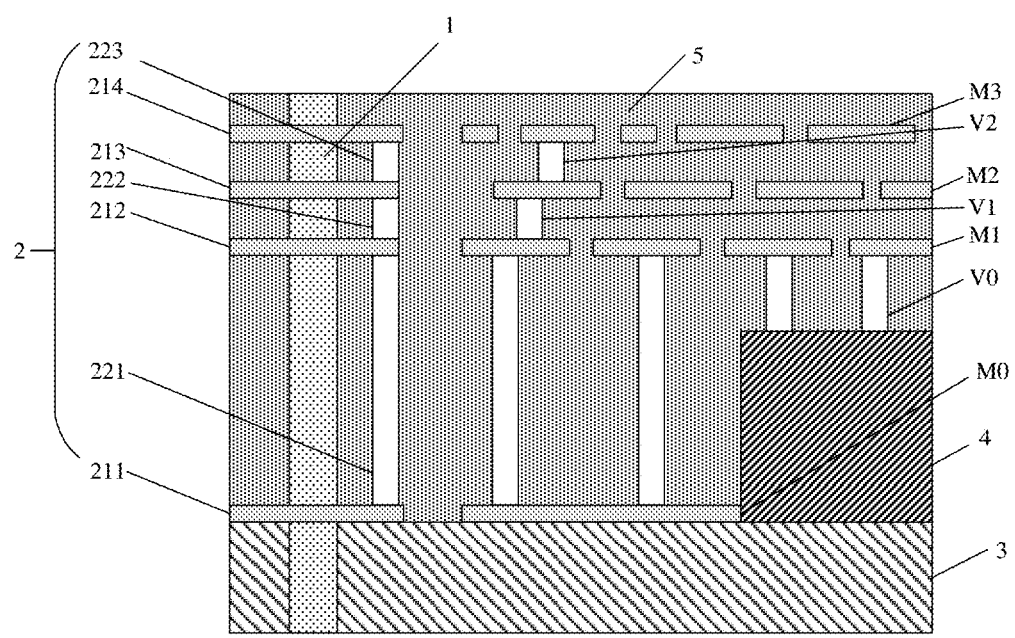

Referring to FIG. 4 and FIG. 5G, S402 is performed to form the through silicon via 1 inside the shielding structure 2 such that the annular shielding layers 211, 212, 213, and 214 surround the through silicon via 1.

In an embodiment, forming the through silicon via 1 includes the following operations.

A through via is formed in the dielectric layer inside the shielding structure 2, which penetrates the dielectric layer located inside the shielding structure 2; and depositing a conductive material in the through via to form the through silicon via 1.

In an embodiment, the through silicon via 1 penetrates the substrate 3.

In some embodiments, the through silicon via has a diameter of 2-6 μm, e.g., 3 μm.

There is a gap "d" between the outer side wall of the through silicon via and the inner side wall of an annular shielding layer, and the size of the gap "d" affects the shielding effect of the shielding structure. In some embodiments, the width of the gap "d" is 1-10 μm.

In an embodiment, forming the through silicon via 1 inside the shielding structure 2 further includes the following operation.

A conductive structure (referring to FIG. 3A) that is configured to electrically connect the through silicon via 1 and the annular shielding layer 214 farthest from the substrate is formed.

In an actual process, the through silicon via is located in a peripheral circuit region, and configured to transmit signals between vertically stacked devices.

Figure 5H:
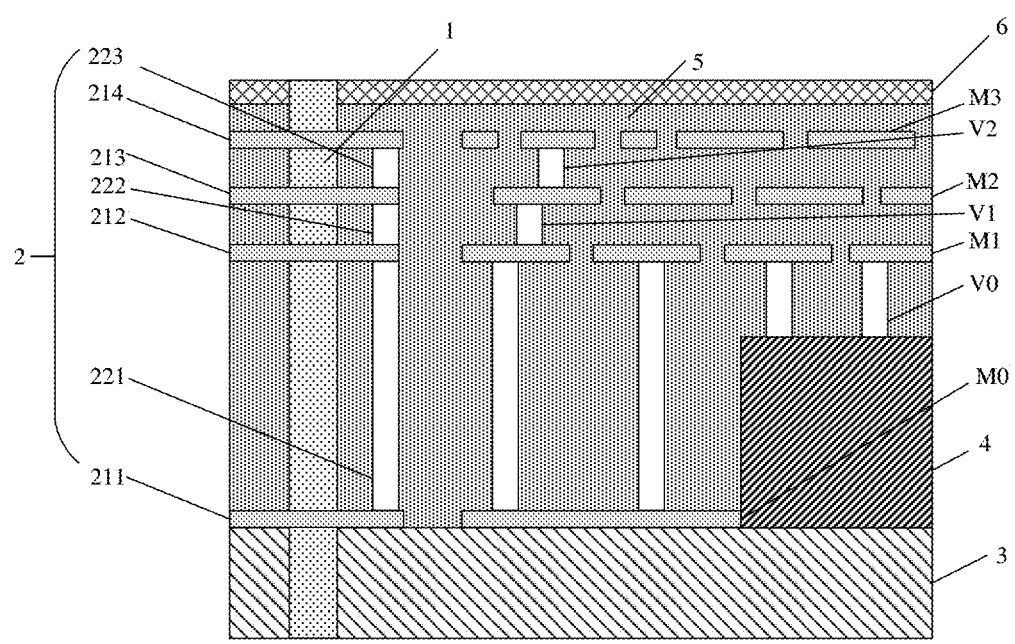

Referring to FIG. 5H, a dielectric layer is formed above the annular shielding layer 214 and the metal layer M3, and a passivation layer 6 is formed above the dielectric layer.

In some embodiments, the passivation layer 6 includes, but is not limited to, silicon oxide, silicon nitride, or phosphosilicate glass.

It should be noted that after the formation of the through silicon via, a metal conductive structure may also be formed on the through silicon via to facilitate signal transmission.

The above descriptions are merely preferred embodiments of the present disclosure and are not intended to limit the protection scope of the present disclosure. Any modifications, equivalent replacements and improvements made in the spirit and principles of the present disclosure shall fall within the protection scope of the present disclosure.

The invention claimed is:

1. A semiconductor structure, comprising a through silicon via and a shielding structure disposed at an outer side of the through silicon via, wherein,
   the shielding structure comprises at least two non-closed annular shielding layers surrounding the through silicon via and at least one conductive plug configured to connect two adjacent ones of the non-closed annular shielding layers, and the at least two non-closed annular shielding layers and the at least one conductive plug are alternately distributed along an extending direction of the through silicon via and sequentially connected to form a conductive path; and
   current flow directions in the two adjacent ones of the non-closed annular shielding layers in the conductive path are opposite.

2. The semiconductor structure according to claim 1, wherein each of the non-closed annular shielding layers comprises a current inflow end and a current outflow end, and a relative positional relationship between the current inflow ends and the current outflow ends of any two adjacent non-closed annular shielding layers is reversed such that the current flow directions in the two adjacent ones of the non-closed annular shielding layers in the conductive path are opposite.

3. The semiconductor structure according to claim 2, wherein a distance between the current inflow end and the current outflow end of each of the non-closed annular shielding layers is smaller than a line width of the non-closed annular shielding layer.

4. The semiconductor structure according to claim 1, wherein projections of the at least two non-closed annular shielding layers in the extending direction of the through silicon via at least partially overlaps, and a projection of the conductive plug in the extending direction of the through silicon via falls into projections of two adjacent ones of the non-closed annular shielding layers in the extending direction of the through silicon via.

5. The semiconductor structure according to claim 1, wherein a number of the non-closed annular shielding layers is 2-6.

6. The semiconductor structure according to claim 1, wherein a shape of the non-closed annular shielding layers comprises a non-closed circle or a non-closed polygon.

7. The semiconductor structure according to claim 1, wherein there is a gap between an outer side wall of the through silicon via and inner side walls of the non-closed annular shielding layers, and a width of the gap is 1-10 μm.

8. The semiconductor structure according to claim 1, further comprising: a metal conductive structure which comprises at least two metal layers and at least one contact hole configured to connect two adjacent ones of the metal layers, wherein the metal layers and the contact hole are alternately distributed in the extending direction of the through silicon via.

9. The semiconductor structure according to claim 8, wherein each non-closed annular shielding layer of the shielding structure and the corresponding metal layer of the metal conductive structure, which are at a same or similar height in the extending direction of the through silicon via, are formed simultaneously in a same process; and each conductive plug of the shielding structure and the corresponding contact hole of the metal conductive structure, which are at a same or similar height in the extending direction of the through silicon via, are formed simultaneously in a same process.

10. The semiconductor structure according to claim 8, wherein one of the metal layers of the metal conductive structure is electrically connected to the through silicon via through a non-closed opening of one of the non-closed annular shielding layers of the shielding structure.

11. The semiconductor structure according to claim 1, further comprising: a dielectric layer covering the through silicon via, the non-closed annular shielding layers and the conductive plug.

12. A method for manufacturing a semiconductor structure, comprising:
    forming a shielding structure which comprises at least two non-closed annular shielding layers and at least one conductive plug configured to connect two adjacent ones of the non-closed annular shielding layers, wherein forming the shielding structure comprises: alternately forming the at least two non-closed annular shielding layers and the at least one conductive plug, and sequentially connecting the non-closed annular shielding layers and the conductive plug to form a conductive path; wherein current flow directions of the two adjacent ones of the non-closed annular shielding layers in the conductive path are opposite; and
    forming a through silicon via on inside the shielding structure such that the non-closed annular shielding layers surround the through silicon via.

13. The manufacturing method according to claim 12, wherein each of the non-closed annular shielding layers comprises: a current inflow end and a current outflow end, and the relative positional relationship between the current inflow ends and the current outflow ends of any two adjacent non-closed annular shielding layers is reversed such that the current flow directions in the two adjacent ones of the non-closed annular shielding layers in the conductive path are opposite.

14. The manufacturing method according to claim 13, wherein a distance between the current inflow end and the current outflow end of each of the non-closed annular shielding layers is smaller than a line width of the non-closed annular shielding layer.

15. The manufacturing method according to claim 12, wherein projections of the at least two non-closed annular shielding layers in an extending direction of the silicon via at least partially overlap, and a projection of the conductive plug in the extending direction of the through silicon via falls within projections of two adjacent ones of the non-closed annular shielding layers in the extending direction of the through silicon via.

16. The manufacturing method according to claim 12, wherein a number of the non-closed annular shielding layers is 2-6.

17. The manufacturing method according to claim 12, further comprising:
    forming a metal conductive structure at the same time of forming the shielding structure, wherein the metal conductive structure comprises at least two metal layers and at least one contact hole configured to connect two adjacent ones of the metal layers, and the metal layers and the contact hole are alternately distributed in an extending direction of the through silicon via.

18. The manufacturing method according to claim 17, wherein forming the metal conductive structure at the same time of forming the shielding structure comprises:
    forming each non-closed annular shielding layer of the shielding structure and the corresponding metal layer of the metal conductive structure, which are at a same or similar height in the extending direction of the through silicon via, simultaneously in a same process; and
    forming each conductive plug of the shielding structure and the corresponding contact hole of the metal conductive structure, which are at a same or similar height in the extending direction of the through silicon via, simultaneously in a same process.

19. The manufacturing method according to claim 12, wherein the semiconductor structure further comprises a dielectric layer; and forming the shielding structure comprises:
    forming the dielectric layer; and
    forming the shielding structure in the dielectric layer that covers the at least two non-closed annular shielding layers and the at least one conductive plug.

* * * * *